United States Patent
Ogasawara

(10) Patent No.: US 7,974,140 B2
(45) Date of Patent: Jul. 5, 2011

(54) SEMICONDUCTOR DEVICE HAVING A MODE REGISTER AND A PLURALITY OF VOLTAGE GENERATORS

(75) Inventor: Masashi Ogasawara, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 372 days.

(21) Appl. No.: 12/361,073

(22) Filed: Jan. 28, 2009

(65) Prior Publication Data

US 2009/0190414 A1    Jul. 30, 2009

(30) Foreign Application Priority Data

Jan. 30, 2008    (JP) ................................ 2008-019813

(51) Int. Cl.
*G11C 5/14*      (2006.01)
(52) U.S. Cl. .................... 365/189.09; 365/194; 365/227
(58) Field of Classification Search ............. 365/189.09, 365/194, 227
See application file for complete search history.

(56) References Cited

U.S. PATENT DOCUMENTS

| | | | | |
|---|---|---|---|---|
| 5,404,338 A | * | 4/1995 | Murai et al. | 365/189.05 |
| 5,963,467 A | * | 10/1999 | Miyatake et al. | 365/226 |
| 6,373,753 B1 | * | 4/2002 | Proebsting | 365/189.09 |

FOREIGN PATENT DOCUMENTS

JP              64-42850        2/1982

* cited by examiner

*Primary Examiner* — Tuan T. Nguyen
(74) *Attorney, Agent, or Firm* — McDermott Will & Emery LLP

(57) ABSTRACT

A semiconductor device includes a mode register and a plurality of voltage generators in connection with a plurality of banks. Based on an operation mode set to the mode register, the voltage generators are selectively driven in response to an access to each bank and a CAS latency number defining a delay time between the input timing of an external command and the input/output timing of data of each bank. The number of voltage generators being driven is controlled based on the CAS latency number so that an adequate internal voltage is supplied to the peripheral circuitry, thus adjusting the current consumption without increasing the power consumption.

15 Claims, 6 Drawing Sheets

FIG. 5

| RA6 | RA5 | RA4 | CL |
|-----|-----|-----|----|
| 0 | 1 | 0 | 2 |
| 0 | 1 | 1 | 3 |
| 1 | 0 | 0 | 4 |
| 1 | 0 | 1 | 5 |
| 1 | 1 | 0 | 6 |
| 1 | 1 | 1 | 7 |

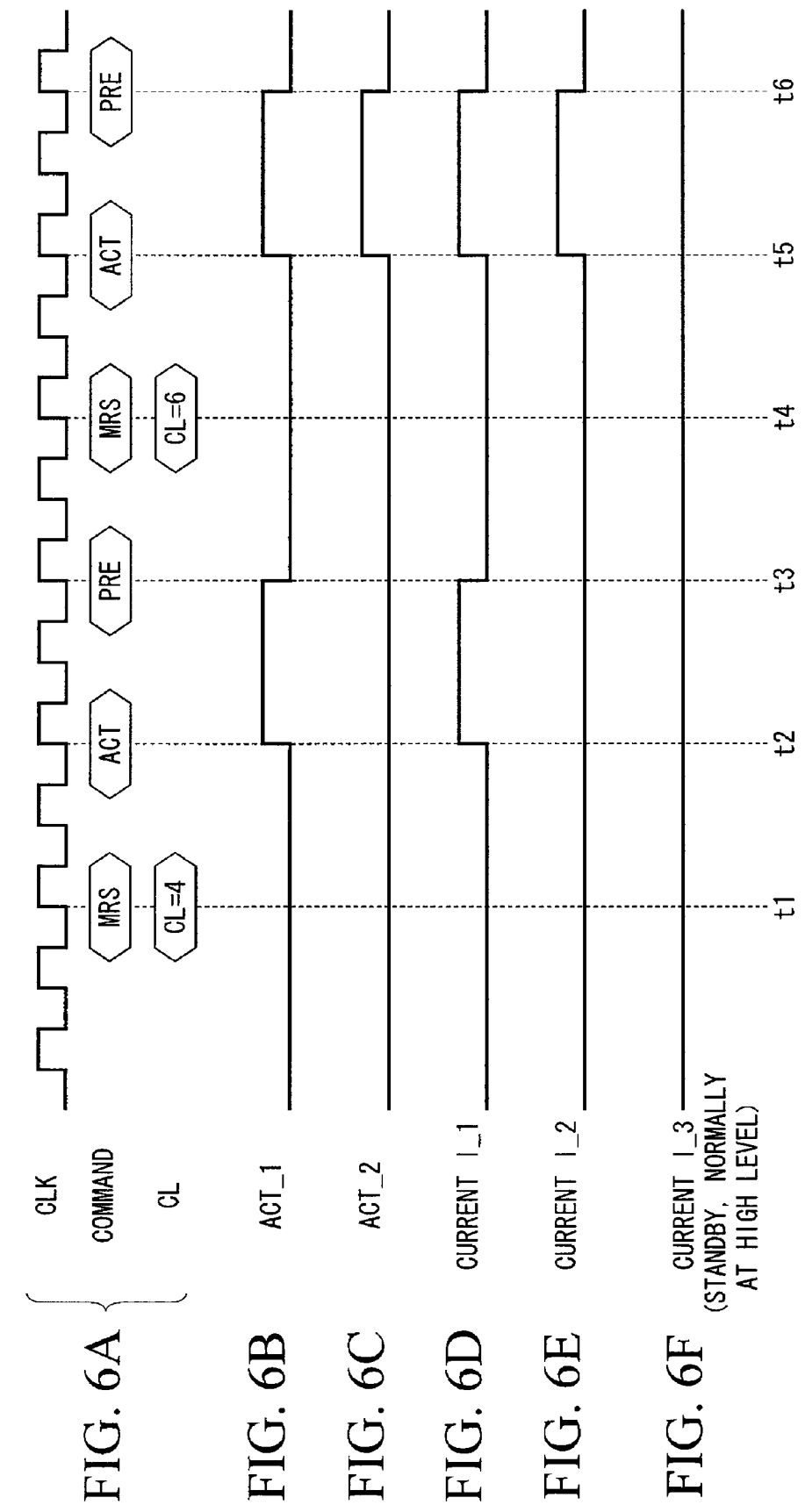

SEMICONDUCTOR DEVICE HAVING A MODE REGISTER AND A PLURALITY OF VOLTAGE GENERATORS

BACKGROUND OF THE INVENTION

1. Field of the Invention

The present invention relates to semiconductor devices such as dynamic random-access memories (DRAM).

The present application claims priority on Japanese Patent Application No. 2008-19813, the content of which is incorporated herein by reference.

2. Description of Related Art

In semiconductor devices such as dynamic random-access memories (DRAM), consumed current values increase as internal frequencies of internal circuits composed of metal-oxide semiconductor (MOS) transistors, For this reason, it is necessary for semiconductor devices to use a plurality of voltage generators having high current capacities, which in turn excessively consume currents in case of low current consumption modes, thus increasing total power consumption.

To cope with such a drawback, various technologies have been developed and disclosed in various documents such as Patent Document 1.

Patent Document 1: Japanese Unexamined Patent Application Publication No. S64-42850

The semiconductor device as disclosed in Patent Document 1 has a plurality of voltage generators so as to detect the internal frequency thereof, wherein the number of voltage generators being driven is decreased when the internal frequency is low, while it is increased when the internal frequency is high, thus generating an appropriate amount of current in response to power consumption. This technology prevents unnecessarily high levels of current from being generated, thus achieving low power consumption in semiconductor devices.

The present inventor has recognized that the above semiconductor device requires detection circuitry and control circuitry for detecting plural operating frequencies so as to turn on and off the plurality of voltage generators. This increases the overall layout area, i.e. the chip size of the semiconductor device, thus pushing up the manufacturing cost.

In addition, the above semiconductor device suffers from a problem in that power consumption cannot be substantially reduced because of the consumption of current by the detection circuitry and control circuitry.

SUMMARY

The invention seeks to solve the above problem, or to improve the problem at least in part.

In one embodiment, there is provided a semiconductor device having a mode register for inputting a latency number defining a delay time between the input timing of an external command and the input/output timing of data in relation to an operation mode in connection with a plurality of banks. The semiconductor device includes a plurality of voltage generators for generating internal voltages and a controller for controlling the number of the voltage generators being driven in response to the latency number.

In another embodiment, there is provided a semiconductor device which includes a first voltage generator that is driven to generate a first voltage in response to an access to each bank and a second voltage generator that is driven to generate a second voltage in response the latency number. The first voltage generator is coupled with the second voltage generator so as to sum up the first voltage and the second voltage.

The internal frequency of the semiconductor device becomes higher so as to increase the operating speed when the CAS latency number is equal to or more than a threshold value, while it becomes lower when the CAS latency number is less than the threshold value. The semiconductor device is designed to increase the number of voltage generators to be driven when the CAS latency number is equal to or more than the threshold value compared to when the CAS latency number is less than the threshold value. This eliminates the necessity of incorporating the complex circuitry for detecting the internal frequency; hence, it is possible to achieve low power consumption without increasing the overall layout area of the semiconductor device.

BRIEF DESCRIPTION OF THE DRAWINGS

The above features and advantages of the present invention will be more apparent from the following description of certain preferred embodiments taken in conjunction with the accompanying drawings, in which:

FIG. 5 is a table showing the relationship between a CAS latency number CL and data RA4, RA5, and RA6 in connection with a detector coupled with a mode register shown in FIG. 4;

FIG. 6A shows an internal clock signal CK in connection with commands and the CAS latency number CL;

FIG. 6B shows a signal ACT_1 which is set to a high level when one bank is selectively activated;

FIG. 6C shows a signal ACT_2 which is produced in connection with the signal ACT_1;

FIG. 6D shows a current I_1 generated by a voltage generator 200 shown in FIG. 2;

FIG. 6E shows a current I_2 generated by a voltage generator 201 shown in FIG. 2; and FIG. 6F shows a current I_3 generated by a voltage generator 202 shown in FIG. 2.

DETAILED DESCRIPTION OF PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
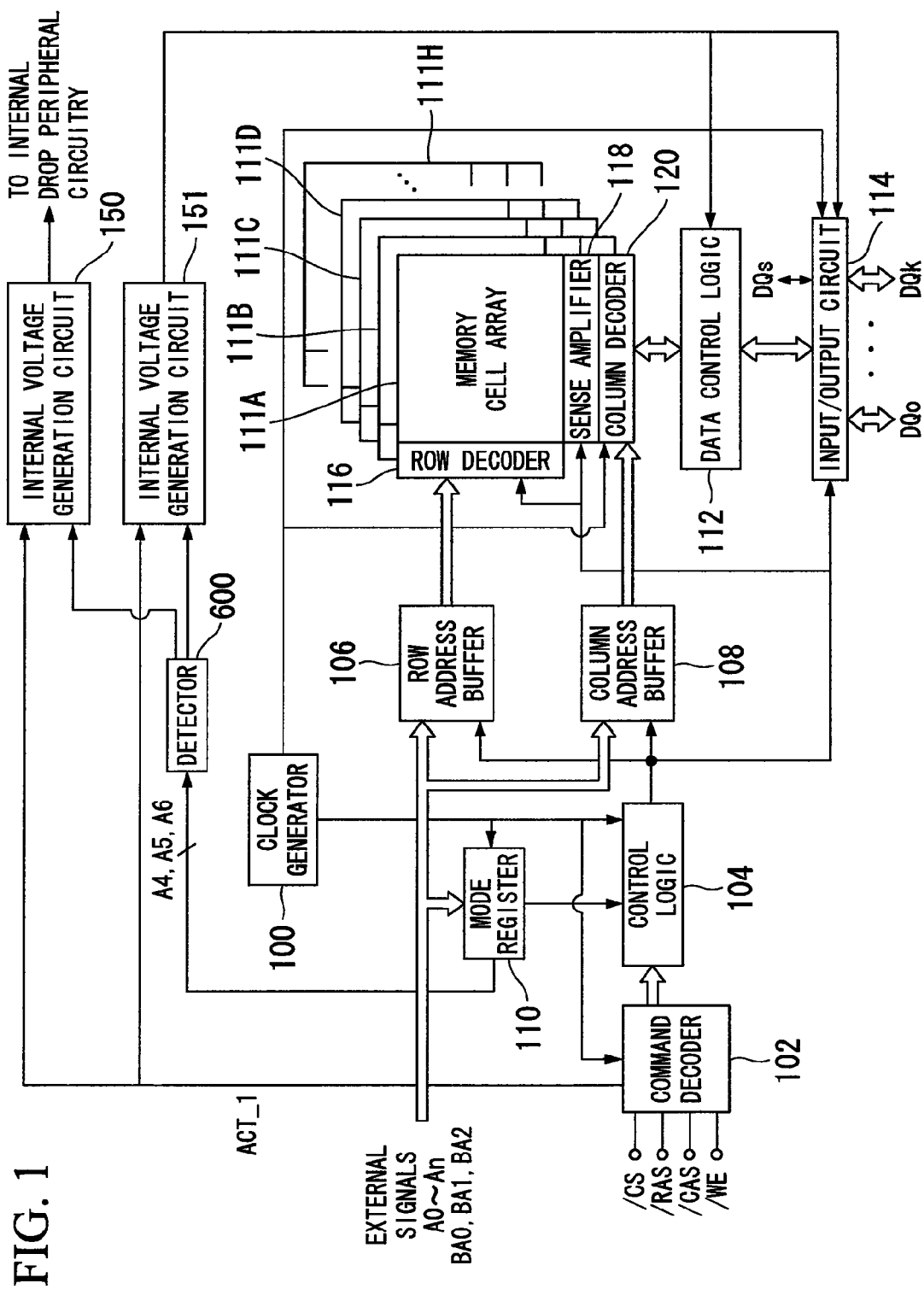
FIG. 1 is a block diagram showing the constitution of a semiconductor device according to a first embodiment of the present invention.

A semiconductor device according to a first embodiment of the present invention is directed to a DDR2 SDRAM (i.e. Double Data Rate 2 Synchronous Dynamic Random-Access Memory). FIG. 1 is a block diagram showing the constitution of the semiconductor device of the first embodiment.

The semiconductor device of FIG. 1 includes eight banks 111A, 111B, 111C, . . . , and 111H, each of which is constituted of plural word lines and plural bit lines, a memory cell array including memory cells located at intersecting points between word lines and bit lines, a row address decoder (or a row decoder) 116 for selecting word lines, a sense amplifier 118 for amplifying data read on bit lines, and a column address decoder (or a column decoder) 120 for selecting bit lines.

Based on external signals such as /CS, /RAS/, /CAS, and /WE supplied from an external device (not shown) as well as addresses A0 to An (where n=13, for example, in the present embodiment) and bank addresses BA0, BA1, and BA2, a command decoder 102 writes operation modes representative of burst lengths (i.e. time lengths) in burst read/write modes and CAS latency numbers (i.e. numbers of latencies regarding Column Address Strobe) into a mode register 110. The CAS latency is a parameter of a time length which is measured in units of internal clock pulses (CK) between the time when a read command for designating data to be read from a specific memory cell inside the DRAM is input and the time when data from the memory cell is actually output.

The command decoder 102 performs read/write operations on data with memory cells in response to operation modes representative of burst lengths and CAS latency numbers described in the mode register 110 inputting external signals in connection with read/write operations.

Based on the output data of the mode register 110 and the output data of the command decoder 102, a control logic 104 controls a row address buffer 106 to output row addresses to the row address decoder 116 while controlling a column address buffer 108 to output column addresses to the column address decoder 120.

A clock generator 100 generates an internal clock signal CK having the prescribed frequency.

When the CAS latency number is relatively large, current consumption increases as the internal clock frequency (or internal frequency) increases in order to secure a normal read operation.

When the CAS latency number is relatively small, it is possible to reduce the current consumption by slowing down the internal operation because the normal read operation can be secured irrespective of a reduction in the internal clock frequency.

The present invention uses the CAS latency number as a critical threshold of current consumption, wherein when the CAS latency number described in the mode register 110 is higher than the threshold value so that the current consumption is higher than the case where the CAS latency number is lower than the threshold value, each bank 111 is supplied with a maximum current value allowed for the internal frequency.

When the CAS latency number described in the mode register 110 is lower than the threshold value so that the current consumption is lower than the case where the CAS latency number is higher than the threshold value, the maximum current allowed for the case lower than the CAS latency number is supplied to the internal drop peripheral circuitry in the form of an internal voltage V. The present embodiment is designed to estimate the current consumption used in the semiconductor device based on the CAS latency number, thus controlling the number of voltage generators.

The present embodiment is designed to partition the range of the current consumption into two regions based on the CAS latency number when the banks 111 are activated. In order to precisely control the current consumption, it is possible to use a plurality of threshold values so as to further increase the number of regions of the current consumption.

The row address buffer 106 temporarily holds address data representative of row addresses and then outputs them to the row address decoder 116.

The column address buffer 108 temporarily holds address data representative of column addresses and then outputs them to the column address decoder 120.

Specifically, the row address decoder 116 activates one of word lines in the memory cell array of each bank 111 based on the row address output from the row address buffer 106.

The column address decoder 120 selects one of bit lines in the memory cell array of each bank 111 based on the column address output from the column address buffer 108.

The sense amplifier 118 is selected by the word line so as to amplify data read onto the bit line.

A data control logic 112 performs either a burst read operation or a burst write operation in accordance with the burst length which is determined in advance.

Based on a control signal output from the control logic 104, an input/output circuit 114 performs input/output operations on data DQ0 to DQk (where k=3 in the present embodiment) with an external device (not shown).

Figure 2:
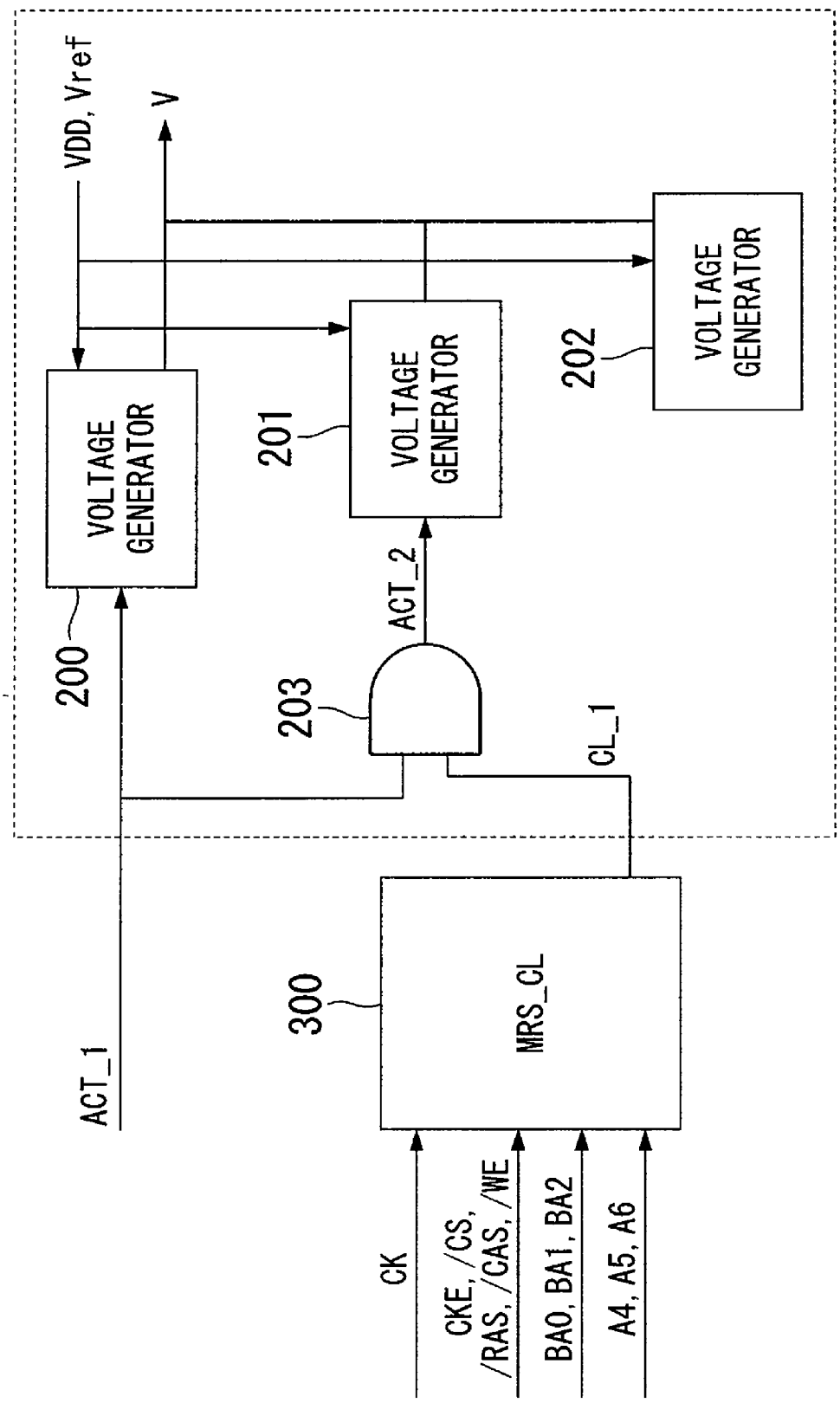
FIG. 2 is a block diagram showing the constitution of an internal voltage generation circuit included in the semiconductor device shown in FIG. 1.

Both of internal voltage generation circuits 150 and 151 have the same constitution as shown in FIG. 2, which is constituted of voltage generators 200, 201, and 202, an AND circuit 203, and an MRS_CL 300 for generating a control signal CL_1.

The internal voltage generation circuit 150 generates an electric current so as to supply an internal voltage V to the internal drop peripheral circuitry (i.e. internal peripheral circuits such as the row address buffer 106 and the column address buffer 108 except for control circuits such as the data control logic 112, the input/output circuit 114, and the sense amplifier 118 applied to the memory cell array).

The internal voltage generation circuit 151 supplies an internal voltage V to the data control logic 112 and the input/output circuit 114 (except for its input/output buffer, not shown).

For example, the internal voltage V generated by the internal voltage generation circuit 150 is set to 1.8 V, while the internal voltage V generated by the internal voltage generation circuit 151 is set to 1.3 V. Compared with the internal voltage of the internal voltage generation circuit 150, the internal voltage of the internal voltage generation circuit 151 is reduced so as to reduce power consumption and to suppress the noise thereof.

Figure 3:
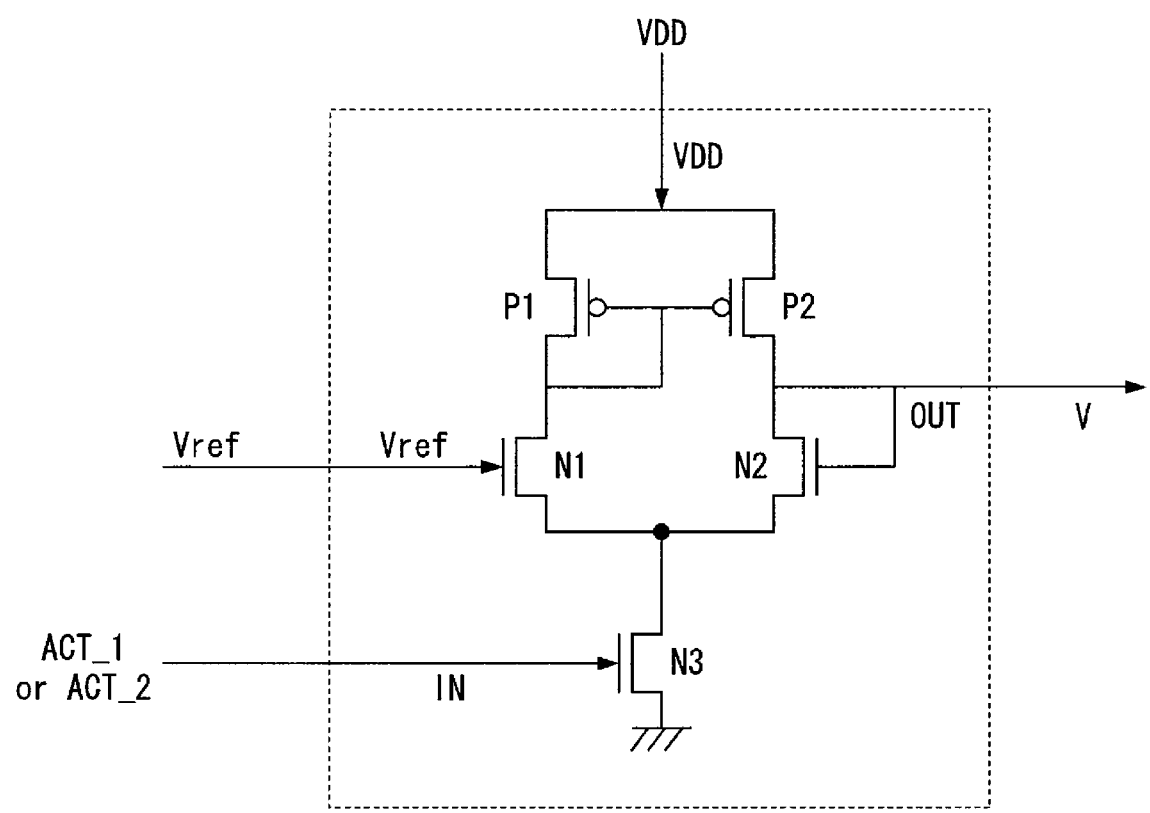
FIG. 3 is a circuit diagram showing the constitution of a voltage generator shown in FIG. 2.

All the voltage generators 200 to 202 have the same constitution as shown in FIG. 3, which is formed using a current mirror circuit. Based on a reference voltage drop Vref (which is generated by the internal circuitry) and an external voltage VDD (which is supplied from an external device, not shown), the voltage generator of FIG. 3 generates and outputs the internal voltage V at an output terminal OUT. The voltage generator 200 receives a signal ACT_1 at an input terminal IN while the voltage generator 201 receives a signal ACT_2 at the input terminal IN, wherein the voltage generators 200 and 201 are driven in response to high levels set to the signals ACT_1 and ACT_2. The voltage generator 202 normally receives a high-level signal at the input terminal IN thereof and is normally driven.

Specifically, the voltage generator of FIG. 3 is constituted of p-channel MOS transistors (or PMOS transistors) P1 and P2, and n-channel MOS transistors (or NMOS transistors) N1, N2, and N3.

The external voltage VDD is supplied to the source of the PMOS transistor P1, the gates and drains of which are connected together. The external voltage VDD is also supplied to the source of the PMOS transistor P2, whose gate is connected to the gate of the PMOS transistor P1 and whose drain is connected to the output terminal OUT.

The drain of the NMOS transistor N1 is connected to the drain of the PMOS transistor P1, and the gate thereof receives the reference voltage drop Vref. Both the drain and gate of the NMOS transistor N2 are connected to the output terminal OUT. The drain of the NMOS transistor N3 is connected to the sources of the NMOS transistors N1 and N2; the gate thereof is connected to a line for transferring the signal ACT_1; and the source thereof is grounded.

The signal ACT_1 which is output from the command decoder 102 is set to a high level when one of the banks 111A to 111H is selected and activated in response to an ACT command. Without the ACT command, the signal ACT_1 is set to a low level.

Figure 4:
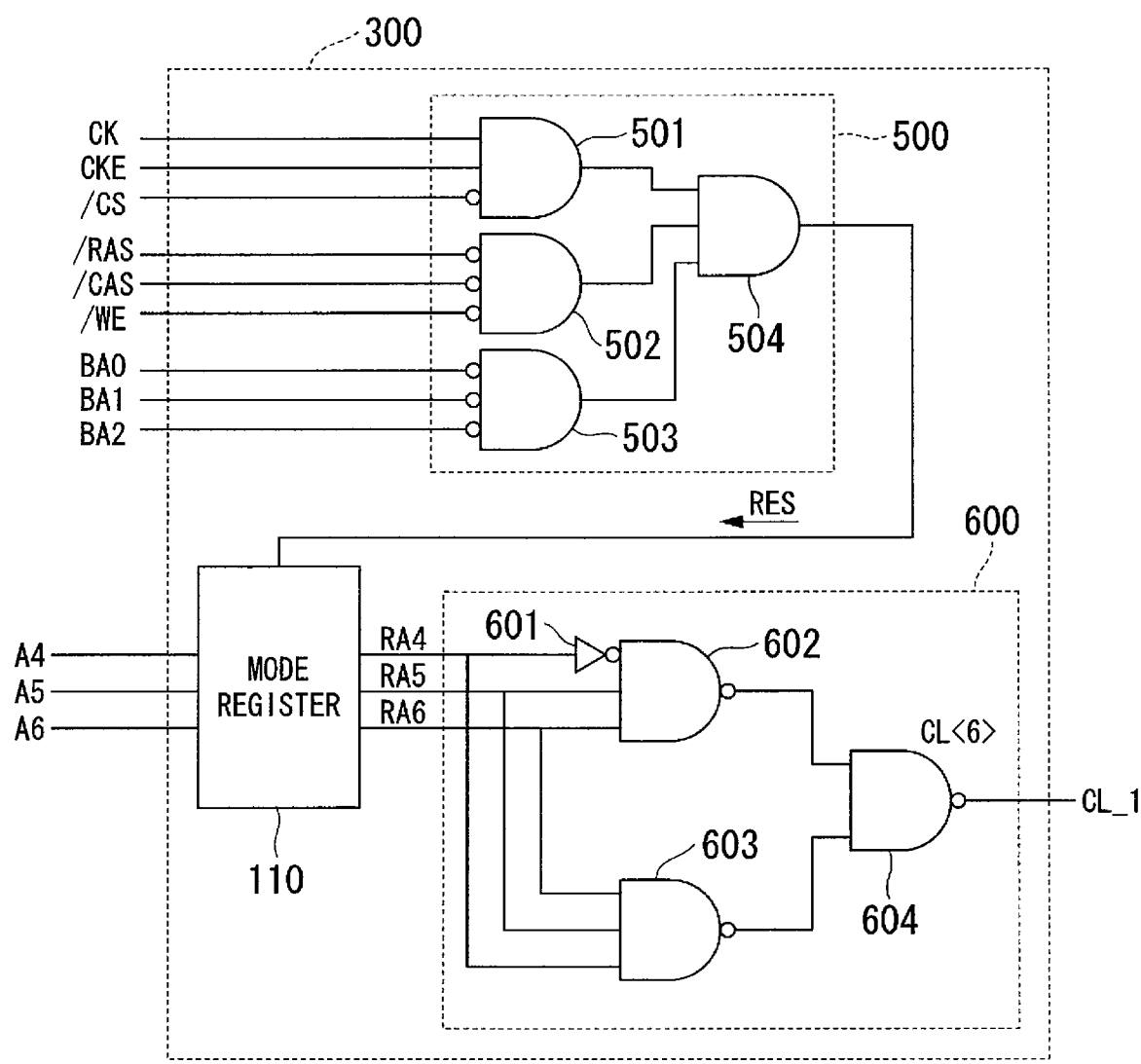
FIG. 4 is a block diagram showing the constitution of an MRS_CL shown in FIG. 2.

FIG. 4 shows the constitution of the MRS_CL 300 shown in FIG. 2. The MRS_CL 300 is constituted of the mode register 110 which sets the CAS latency number based on address data (e.g. A4, A5, and A6 transferred via address signal lines), a logic circuit 500 which generate a setting signal RES for setting the address data to the mode register 110, and a detector 600 for controlling whether to drive the voltage generator 200 based on the CAS latency number.

The mode register 110 and the logic circuit 500 may have previously existed in the MRS_CL 300; hence, the new constituent element is the detector 600.

The logic circuit 500 is constituted of an AND circuit 501 having three inputs, one of which is a negated input corresponding to /CS, an AND circuit 502 having three negated inputs, an AND circuit 503 having three negated inputs, and an AND circuit 504.

The logic circuit 500 generates and outputs the setting signal RES having a high level to the mode register 110, wherein the setting signal RES designates a prescribed condition in which, in response to a high level of the internal clock signal CK, external signals CKE, /CS, /RAS, /CAS, and /WE as well as bank addresses BA0, BA1, and BA2 are respectively set to "H", "L", "L", "L", "L", "L", and "L" (where "H" denotes a high level, and "L" denotes a low level). Upon reception of the setting signal RES, the mode register 110 stores address data A4, A5, and A6 input thereto so as to store them in the form of data RA4, RA5, and RA6. The mode register 110 is designed to maintain the previously set values regarding the burst length and the CAS latency number unless they are reloaded.

The detector 600 is constituted of an inverter 601 and NAND circuits 602, 603, and 604. The CAS latency number "CL" is determined based on combinations of "0" and "1" representing the data RA4, RA5, and RA6 in accordance with the table shown in FIG. 5. Only when the CAS latency number is equal to "6" or "7", the detector 600 generates a control signal CL_1 for determining whether or not to drive the voltage generator 201. It is possible to use the CAS latency number in other semiconductor devices (other than the semiconductor device of the present embodiment), each of which is designed to change the number of voltage generators in response to the CAS latency number, in other words, each of which is designed to appropriately change the threshold of the CAS latency number for outputting the control signal CL_1 (having a high level) in connection with the detector 600.

Referring to FIG. 2, when one of the banks 111A to 111H is activated so that the voltage generator of FIG. 3 receives the signal ACT_1 having a high level, the control signal CL_1 having a high level is output in response to the CAS latency number which is "6" or more so that the signal ACT_2 having a high level is output from the AND circuit 203.

The signal ACT_2 is used to determine whether or not to drive the voltage generator 201, wherein the voltage generator 201 is driven by a high level but is not driven by a low level.

Next, the control operation for controlling the number of voltage generators 200 to 202 installed in the semiconductor device of the present invention will be described with reference to FIGS. 1, 2, and 4 as well as FIGS. 6A to 6E which are timing charts representing an example of the control operation. FIG. 6A shows the internal clock signal CK in connection with commands and the CAS latency number CL; FIG. 6B shows the signal ACT_1; FIG. 6C shows a current I_1 generated by a voltage generator 200; FIG. 6D shows a current I_2 generated by the voltage generator 201; and FIG. 6E shows a current I_3 generated by the voltage generator 202.

At time t1, the semiconductor device inputs an MRS command for inputting mode data to the mode register 110. At a high level of the internal clock signal CK, the external signals CKE, /CS, /RAS, /CAS, and /WE as well as the bank addresses BA0, BA1, and BA2 are respectively set to "H", "L", "L", "L", "L", "L", "L", and "L" so that the logic circuit 500 outputs the setting signal RES to the mode register 100, whereby the "presently supplied" address data A4, A5, and A6 (used for setting the CAS latency number) are set to the mode register 110.

Figure 5:
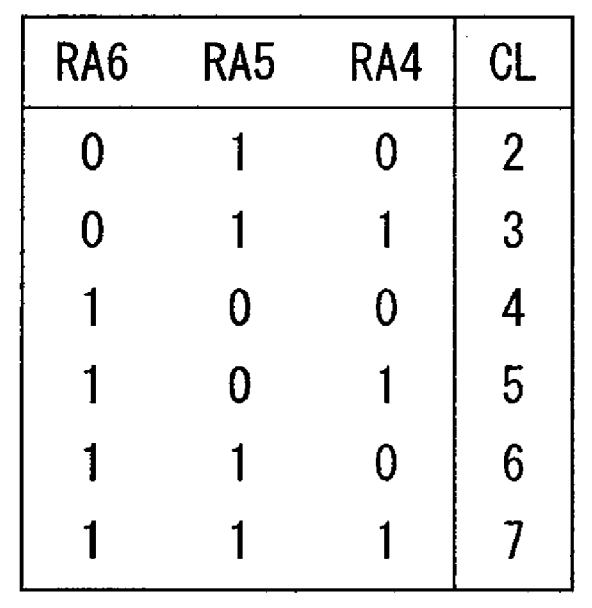

At this time, the address data A4, A5, and A6 are set to "0", "0", and "1" so that the corresponding data RA4, RA5, and RA6 for designating the CAS latency number CL=4 are set to the mode register 110. As shown in FIG. 5, the data RA4, RA5, and RA6 are set to "0", "0", and "1" so that the CAS latency number CL is less than "6", so that the detector 600 does not output the control signal CL_1, that is, the control signal CL_1 is maintained at a low level.

At time t2, the semiconductor device inputs an ACT command so that one of the banks 111A to 111H is activated, so that the signal ACT_1 is set to a high level.

At this time, the voltage generator 200 is driven in response to the signal ACT_1 having a high level. In contrast, the voltage generator 201 is not driven and stopped because the signal ACT_2 having a low level is output from the AND circuit 203 based on the signal ACT_1 having a high level and the control signal CL_1 having a low level.

When the "low" CAS latency number representing the "low" internal frequency is set to the semiconductor device in which the signal ACT_1 having a high level is supplied to the internal voltage generation circuits 150 and 151, the voltage generators 200 and 201 are driven so that the sum of the currents I_1 and I_3 is supplied to the internal drop peripheral circuitry and the input/output circuit 114, wherein the voltage generator 201 is not driven so as to reduce the current consumption in response to the low internal frequency.

At time t3, the semiconductor device inputs a precharge command PRE so as to change the signal ACT_1 from a high-level signal to a low-level signal, thus placing all the banks 111A to 111H in a standby state.

At this time, the voltage generators 200 installed in the internal voltage generation circuits 150 151 are each deactivated so that only the current I-3 generated by the voltage generator 202 is supplied to the internal drop peripheral circuitry and the input/output circuit 114, wherein the current value is limited in the standby state.

At time t4, the semiconductor device inputs an MRS command for inputting mode data into the mode register 110, wherein similar to time t1, the logic circuit 500 outputs the setting signal RES so as to set the address data A4, A5, and A6, which are presently provided to determine the CAS latency number, to the mode register 110.

At this time, the address data A4, A5, and A6 are set to "0", "1", and "1" so that the data RA4, RA5, and RA6 representing the CAS latency number CL=6 (see FIG. 5) are registered with the mode register 110. In other words, the mode register 110 outputs the data RA4, RA5, and RA6 having values "0", "1", and "1" to the detector 600. Since the CAS latency number CL is identical to the threshold value "6", the detector 600 outputs the control signal CL_1 having a high level.

At time t5, similar to time t2, the semiconductor device inputs an ACT command so as to activate one of the banks 111, wherein the signal AC_1 is set to a high level.

The voltage generator 200 is driven by the signal ACT_1 having a high level. At this time, the AND circuit 203 inputs the signals ACT_1 and CL_1 both having a high level so as to output the signal ACT_2 having a high level, thus driving the voltage generator 201, which is stopped before time t5.

When the CAS latency number described in the mode register 110 becomes equal to the threshold of "6" or more, the voltage generator 201, which is provided for the case where the CAS latency number becomes equal to or greater than the threshold value, is newly driven in response to the signal ACT_2 having a high level (output from the AND circuit 203) in addition to the voltage generators 200 and 202, which can be driven even when the CAS latency number is less than the threshold value.

When the signal ACT_1 having a high level is supplied to the internal voltage generation circuits 150 and 151 so that the CAS latency number designates the "high" internal frequency, all the voltage generators 200, 201, and 202 are driven so that the sum of the currents I_1, I_2, and I_3 is supplied to the internal drop peripheral circuitry and the input/output circuit 114, thus increasing the current consumption in response to the high internal frequency.

At time t6, the semiconductor device inputs a precharge command PRE so as to change the signal ACT_1 from the high level to the low level.

At this time, the voltage generators 200 and 201 installed in the internal voltage generation circuits 150 and 151 are each stopped so as to supply only the current I_3 (generated by the voltage generator 202), thus limiting the current consumption in a standby state.

As described above, the current supply (or current consumption) is controlled in response to the activation/deactivation of the banks 111 and the CAS latency number CL (which is less than or equal to the threshold of "6" or more), as follows:

(1) First Mode in which No Bank is Activated

Irrespective of the CAS latency number, only the voltage generator 202 is driven so as to supply only the current I_3 to the internal drop peripheral circuitry and the input/output circuit 114.

(2) Second Mode in which the Bank is Activated but the CAS Latency Number is Less than the Threshold Value "6"

The voltage generators 200 and 202 are driven so as to supply the sum of the currents I_1 and I_3 to the internal drop peripheral circuitry and the input/output circuit 114.

(3) Third Mode in which the Bank is Activated and the CAS Latency Number is Equal to or Greater than the Threshold Value "6"

All the voltage generators 200, 201, and 202 are driven so as to supply the sum of the currents I_1, I_2, and I_3 to the internal drop peripheral circuitry and the input/output circuit 114.

The present embodiment is designed based on simulations and experiments in such a way that current consumption is measured in response to CAS latency numbers so as to determine the amounts of currents generated by plural voltage generators.

That is, the voltage generator 202 has a current capacity for supplying the prescribed current value required by the internal drop peripheral circuitry and the input/output circuit 114 in the standby state.

The voltage generator 200 has a current capacity for supplying the prescribed current value added to the current value of the voltage generator 202, the sum of which is required when the bank 111 is activated but the CAS latency number CL is less than the threshold value "6".

The voltage generator 201 has a current capacity for supplying the prescribed current value added to the current values of the voltage generators 200 and 202, the sum of which is required when the bank 111 is activated so that the internal frequency becomes highest.

The present embodiment is characterized in that the operation condition of the semiconductor device is partitioned into three regions corresponding to the first mode in which no bank is accessed in a standby state, the second mode in which the bank is accessed but the CAS latency number is less than the threshold in a low-frequency condition, and the third mode in which the bank is accessed and the CAS latency number is equal to or greater than the threshold value in a high-frequency condition. The number of voltage generators being driven is determined in advance in relation to the regions of the operation condition of the semiconductor device, wherein it is appropriately changed in response to the regions of the operation condition of the semiconductor device.

The threshold of the CAS latency number can be arbitrarily determined. For example, the threshold value is set to a certain CAS latency number which causes a rapid increase in the current consumption. Alternatively, the threshold value is set to an intermediate value of the CAS latency numbers between the current consumption required in the standby state and the current consumption required for the maximum internal frequency.

As described above, it is possible to supply an adequate current value to each bank in response to its current consumption based on the activation/deactivation of the bank and the CAS latency number, wherein it is possible to prevent the internal voltage generation circuit(s) from generating an unnecessarily high current value, thus achieving low power consumption.

Since the prescribed current values of the voltage generators are determined in advance by way of simulations and experiments, it is possible to easily achieve low power consumption without using the complex circuitry for controlling current values and without increasing the overall layout area of the semiconductor device.

Lastly, it is apparent that the present invention is not limited to the above embodiment, but may be modified and changed without departing from the scope and spirit of the invention.

What is claimed is:

1. A semiconductor device having a mode register for inputting a latency number defining a delay time between a time when an external command is input and a time when data is input/output in relation to an operation mode in connection with a plurality of banks, said semiconductor device comprising:
a plurality of voltage generators for generating internal voltages; and
a controller for controlling the number of the voltage generators being presently driven in response to the latency number.

2. The semiconductor device according to claim 1, wherein the controller stores a prescribed number as a threshold value of the latency number for driving at least one of the voltage generators.

3. The semiconductor device according to claim 2, wherein the controller increases the number of the voltage generators being driven to be higher than the case where the latency number written into the mode register is equal to or greater than the threshold value in comparison with the case where the latency number is less than the threshold value.

4. The semiconductor device according to claim 3, wherein, when the latency number becomes equal to or greater than the threshold value, the controller drives a further number of the voltage generators higher than the number of the voltage generators which are driven when the latency number is less than the threshold value.

5. The semiconductor device according to claim 4, wherein the controller controls the number of the voltage generators to be driven based on an access to each bank in addition to the latency number.

6. The semiconductor device according to claim 1, wherein the plurality of voltage generators includes a first voltage generator for generating a first voltage and a second voltage generator for generating a second voltage.

7. The semiconductor device according to claim 1, wherein the plurality of voltage generators includes a first voltage generator which is driven when each bank is activated and a second voltage generator which is driven when each bank is activated in connection with the latency number, and
wherein the first voltage generator is coupled with the second voltage generator so as to sum up the first voltage and the second voltage.

8. The semiconductor device according to claim 7, wherein the plurality of voltage generators further includes a third voltage generator which is driven in a standby state, and wherein the third voltage generators are coupled with the first voltage generator and the second voltage generator so as to sum up the third voltage with the first voltage and the second voltage.

9. The semiconductor device according to claim 7 further comprising a first internal voltage generation circuit which is composed of the first voltage generator and the second voltage generator so as to supply a first internal voltage to a peripheral circuitry and a second internal voltage generation circuit which is composed of the first voltage generator and the second voltage generator so as to supply a second internal voltage to an input/output circuit.

10. The semiconductor device according to claim 1 further comprising a detector for detecting the latency number described in the mode register, wherein the controller controls the number of the voltage generators to be driven in response to the detected latency number.

11. A semiconductor device comprising:
a first voltage generator which is driven to generate a first voltage in response to an access to a bank; and
a second voltage generator which is driven to generate a second voltage in response a latency number, which defines a delay time between an input timing of an external command and an input/output timing of data, in addition to the access to the bank,
wherein the first voltage generator is coupled with the second voltage generator so as to sum up the first voltage and the second voltage.

12. The semiconductor device according to claim 11 further comprising a third voltage generator which is driven to generate a third voltage in a standby state, wherein the third voltage generator is coupled with the first voltage generator and the second voltage generator so as to sum up the third voltage with the first voltage and the second voltage.

13. The semiconductor device according to claim 11 further comprising a mode register for storing the latency number, wherein the latency number is set to the mode register in response to the external command.

14. The semiconductor device according to claim 11 further comprising a first internal voltage generation circuit which is composed of the first voltage generator and the second voltage generator so as to supply a first internal voltage to the peripheral circuitry and a second internal voltage generation circuit which is composed of the first voltage generator and the second voltage generator so as to supply a second internal voltage to an input/output circuit.

15. The semiconductor device according to claim 11 further comprising a detector for detecting the latency number, based on which the first voltage generator and the second voltage generator are selectively driven.

* * * * *

UNITED STATES PATENT AND TRADEMARK OFFICE
CERTIFICATE OF CORRECTION

PATENT NO. : 7,974,140 B2
APPLICATION NO. : 12/361073
DATED : July 5, 2011
INVENTOR(S) : Masashi Ogasawara Page 1 of 1

It is certified that error appears in the above-identified patent and that said Letters Patent is hereby corrected as shown below:

In the Claims

Claim 3, column 9, line 7 should read: being driven to be higher in the case where the latency Signed and Sealed this
Twenty-ninth Day of April, 2014

Michelle K. Lee
*Deputy Director of the United States Patent and Trademark Office*